United States Patent [19]

Bremer et al.

[11] Patent Number: 4,532,640
[45] Date of Patent: Jul. 30, 1985

[54] PHASE TRACKING LOOP FOR DIGITAL MODEM

[75] Inventors: Gordon Bremer, Clearwater; William Betts, Maderia Beach; Kenneth Martinez, Pinellas Park, all of Fla.

[73] Assignee: Paradyne Corporation, Largo, Fla.

[21] Appl. No.: 407,451

[22] Filed: Aug. 12, 1982

[51] Int. Cl.$^3$ .............................................. H03L 7/08
[52] U.S. Cl. .................................. 375/120; 329/110; 375/39
[58] Field of Search ................ 455/182, 260; 375/39, 375/79, 99, 120, 119; 307/262, 511, 517; 331/1 R, 10, 17; 329/110, 112

[56] References Cited

U.S. PATENT DOCUMENTS

| | | | |
|---|---|---|---|
| 3,821,659 | 6/1974 | Ludwig | 331/1 R |
| 4,091,410 | 5/1978 | Citta | 455/260 |
| 4,333,060 | 6/1982 | Mosley, Jr. et al. | 331/17 |

Primary Examiner—Benedict V. Safourek
Attorney, Agent, or Firm—Kane, Dalsimer, Kane, Sullivan & Kurucz

[57] ABSTRACT

A phase tracking loop is provided for a digital modem. The phase tracking loop rotates the equalized output of the modem by a phase corrector angle generated by a phase error detector, frequency offset integrator and phase corrector integrator. The phase error is obtained by complex multiplexing the coordinates of the received signal with a phase corrector number. The first integrator operates on the sum of the detected phase error. The second integrator operates on the sum of the output of the phase detector and first integrator. The second integrator output comprises the phase corrector angle.

3 Claims, 2 Drawing Figures

PHASE TRACKING LOOP FOR DIGITAL MODEM

BACKGROUND OF THE INVENTION

The present invention relates to modems using QAM modulation techniques and in particular to a circuit for correcting phase jitter and frequency offset impairments.

Phase jitter and frequency offset are two line impairments which have a detrimental effect on the incoming signal a digital modem receives. To prevent these impairments from causing errors in the demodulated modem signal a phase tracking loop may be utilized. Actually, the phase tracking loop is effective with respect to frequency offset and low frequency, low amplitude phase jitter while high amplitude phase jitter sometimes cannot be tracked out by the phase tracking loop.

Heretofore, digital modem designs either contained no phase tracking loop for phase jitter and frequency offset correction or, if they did, they did not decouple the function of the phase tracking loop from the main signal processing function of the modem. As a result, the equalizer error signal would contain the phase shift or jitter components present in the incoming signal.

In view of the above, it is the principal object of the present invention to provide an improved circuit for a digital modem wherein the phase tracking loop function is decoupled from the equalizer function of the modem.

A further object is to provide such a circuit which may be implemented in a conventional digital modem.

Still further objects and advantages will be apparent from the following description of the invention.

SUMMARY OF THE INVENTION

The above and other beneficial objects and advantages are attained in accordance with the present invention by providing a phase tracking loop for a digital modem of the type wherein the equalized output of the modem, i.e. the received signal is rotated by an angle $\phi$ (for phase correction) in which the tracking loop function is decoupled from the equalizer function of the modem. To this end, the rotated eye pattern constellation coordinates of the received signal are multiplied (in the complex domain) by a number which is the complex conjugate of the ideal coordinates to generate a phase error signal. The phase error signal (after suitable gain compensation) is fed to an adder and summed with the fed-back output of the integrator to generate a corrected frequency offset rate signal. This latter signal (after suitable gain compensation) is summed with the phase error signal and is fed to a second integrator with the fed back output of the second integrator. The output of the second integrator comprises the phase corrector angle $\phi$ and is fed to the equalizer output rotating means.

DETAILED DESCRIPTION OF THE PREFERRED EMBODIMENT

Figure 2:
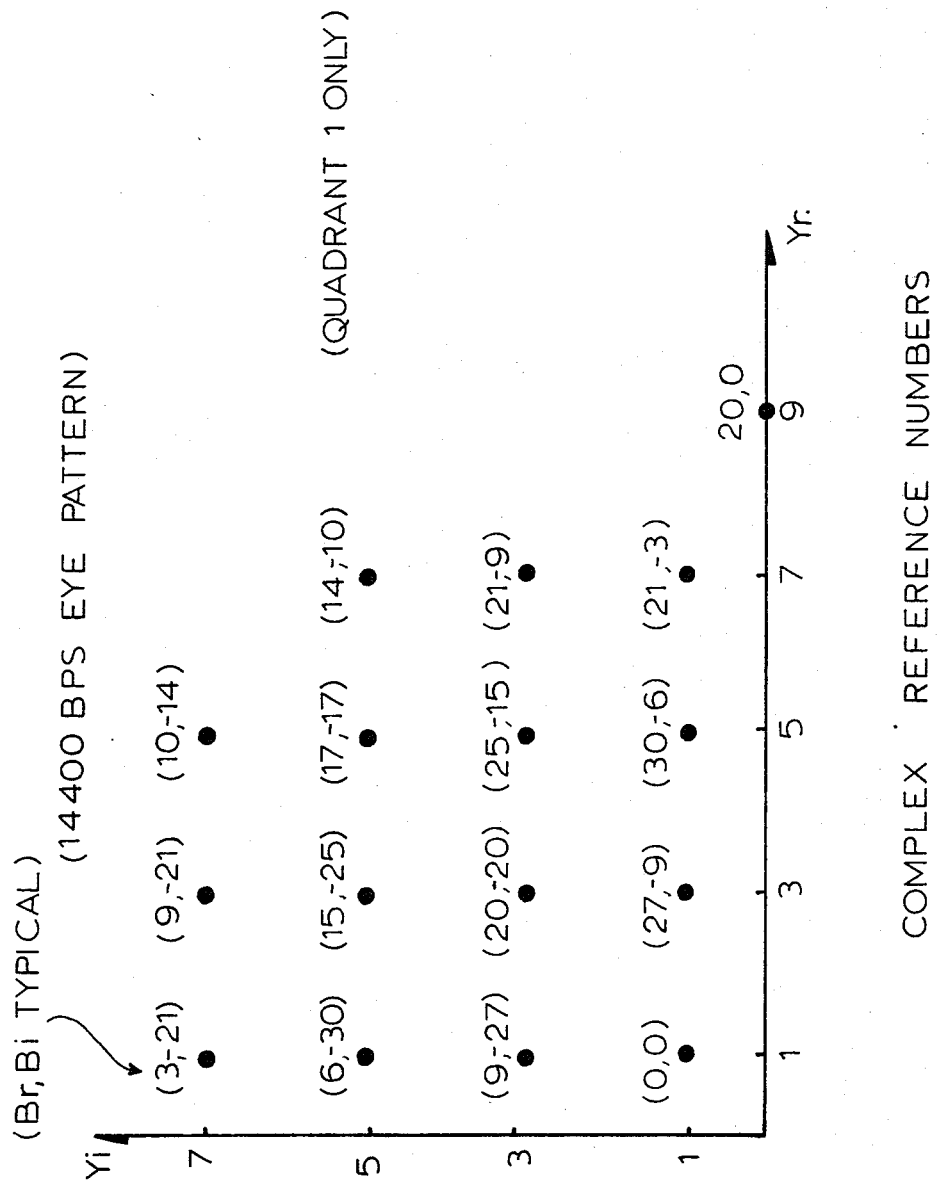

A typical QAM signal may be represented by a complex number with a radial component and a phase. Thus, for example, if a 64-point QAM is used the signals may be represented as points in a complex plane as shown in FIG. 2 (for the sake of clarity only the first quadrant is shown). On this plane the point with coordinates 5, 3 represents phasor 5×j3. The points on these figures represent, of course, ideal points. In actuality noise and other factors cause a degradation of the signals. Assuming that the ideal signal is represented by $A = R \angle P$ (i.e., with radial component R and phase angle P) the corresponding signal having a phase offset of d can be represented as $Y = Y \angle (P+D)$.

In the present invention the signal Y is supplied to a determinator which determines which ideal point A is closest to point Y' and passes on A as a received signal. The determinator also generates a complex phase reference number B is proportional to, but a complex conjugate of A, i.e.

$$B = Bo \angle (-P)$$

where Bo is the radial component of B.

The product of Y and B is a complex number C having a phase of d:

$$C = Y \times B = RBo \angle d$$

or, in rectangular coordinates.

$$C = RBo \cos d + j RBo \sin d.$$ Since d (the phase offset) is very small the imaginary part of C is approximately RBo d.

In other words, the imaginary part of C is proportional to the phase error. However, it has been found that the determinator is simpler to implement if it uses rectangular manipulations. Therefore the received signal is supplied to the determinator in the form $Y = Yr + jYi$ where Yr = real component and
Yi = imaginary component of Y'.

Similarly the phase reference number is given by:

$$B = Br + jBi.$$

Thus the product C may be shown as $$C = Y \times B = (Yr \times Br - Yi \times Bi) + j(Yi \times Bi + Yi \times Br)$$

Therefore the phase error $\phi$ of a received signal A is proportional to $$YrBi + YiBr$$

Once the phase error of a received signal is determined, its value is stored and used to rotate the next signal to eliminate its anticipated error. The process is repeated continuously so that the phase error is continuously updated. This process shall be more fully described in relation to the actual components of the system.

The values for the phase reference number B are shown on FIG. 2 next to each ideal point. For example, the reference number for 1,3 is (9,−27), the reference number for 5,5 is (17,−17) etc. The reason why these numbers were chosen shall become apparent in the discusson below.

As previously stated the phase error d is proportional to the sum of the cross products as defined above. It is evident that the proportionality constant is the radial component of C, i.e., Yo×Bo, where Yo and Bo are the radial components of the received signal Y and the phase reference B respectively. If Bo is constant then when two consecutive Y's having two different radial amplitudes are received, the product Yo×Bo will be different even if the actual phase error is the same. Therefore, the calculated phase error d will also be different. For exaple, if a first received signal corresponds to the ideal point having coordinates 7,1 its radial component is $\sqrt{49+1}=\sqrt{50}=7.1$. If the next received signal corresponds to a second ideal point having coordinates 1,3, its radial component is $\sqrt{1+9}+\sqrt{10}=3.1$. Thus the ratio of the two apparent phase errors is about 2.2.

In order to compensate for this effect the phase reference numbers for points lying closer to the origin are larger than the reference points lying further away. This concept may be illustrated as follows:

If two signals corresponding to ideal points A1=7+j 1, and A2=1+j 3 are received and if there is no phase correction, but the signals have been phase-shifted by +5°, the received signals Y1 and Y2 will have the values of Y1=6.88+j 1.61 and Y2+0.73+j 3.07. From FIG. 2 it can be seen that the corresponding phase reference numbers are B1=21 j 3 and B2=9−J 27.

Therefore the phase error for the first signal is:

$$\phi 1 = 6.88 \times 3 - 21 \times 1.61 = -13.17$$

and the phase error for the second signal is:

$$\phi 2 = 0.73 \times 27 - 9 \times 3.07 = -7.92$$

The ratio of these phase angles is 1.66 which is better than the ratio of 2.2 which would be obtained if a single phase reference number (or phasor) would be used for all the signals in the signal space of FIG. 4. It is to be noted that $\phi 1$ and $\phi 2$ must be scaled before they can be used for correction.

Of course in a similar QAM system in which all the points have the same radial component such as an 8-point QAM system in which the points are separated only by 45° the phase numbers are the complex conjugates of the ideal points without proportioning.

The phase reference number for the point 1,1 was made (0.0) because it was found that this point needs a high amplification which would increase the phase error too much. Thus if a signal is received which is equivalent to point (1,1) its phase error is ignored.

Figure 1:
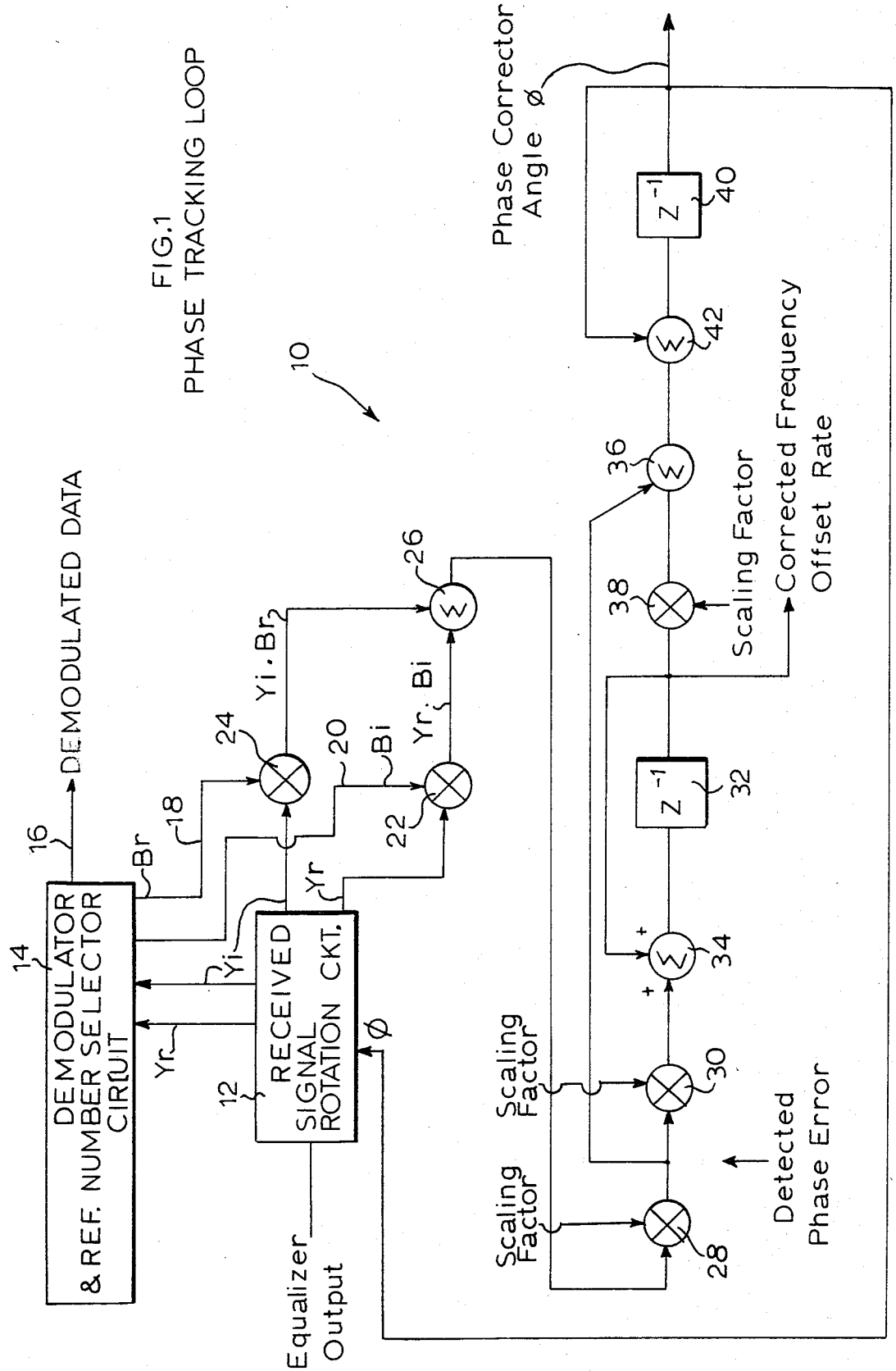
FIG. 1 is a block diagram of the phase tracking loop of the present invention; and, FIG. 2 is an eye pattern (of one quadrant) of the phase corrector reference values for a 14,400 bps 16-point QAM modem.

Reference is now made to the drawings wherein the phase tracking loop 10 of the present invention is depicted in FIG. 1. The tracking loop consists of three basic sections a phase error detector, frequency offset integrator and phase corrector.

The phase detector section is made up of a received signal rotation circuit 12 of the modem which rotates the eye pattern of the equalizer output through an absolute phase angle $\phi$. This function maintains the equalizer eye pattern square thus simplifying the modem demodulator decision. The output of the received signal rotation Y is provided to a demodulator and reference number selector circuit 14 which determines that the received signal is closest to an ideal point A and generates corresponding demodulated data on line 16 and the complex phase reference number Br+jBi on line 18 and 20, respectively.

The phase error is generated by the multiplication of the phase reference number B by the received signal Y (i.e., the output of circuit 12) in the manner described above. The multiplier 22 generates the product Yr×Bi and the multiplier 24 generates the product Yi×Br. The two products are summed in adder 26, and then multiplied by an appropriate scaling factor in multiplier 28 to control the gain of the loop and to obtain the right magnitude for the detected phase error.

The phase error detected by the section described above may be due to either phase jitter, frequency offset, or both. These two sources are readily differentiable. The phase jitter can be expected to cause a generally sinusoidal change in phase. The frequency offset causes, after an initial rise, a constant phase shift. The frequency offset integrator 32 is provided to compensate for the frequecy offset. After suitable scaling by multiplier 30, the detected phase error is fed into the integrator 32 through sumer 34. The old output of the integrator is fed back into the sumer 34 so that the integrator which is in effect a memory element is updated whenever there is a new detected phase error signal. The output of the frequency offset integrator is available for monitoring the frequency offset.

The detected phase error (i.e., output of multiplier 28) is also fed to adder 36 the other input of which is connected to the frequency offset integrator 32 output multiplied by a factor in multiplier 38. The output of adder 36 is fed to the phase integrator 40 through adder 42 which is fed back the output of integrator 40. Thus integrator 40 is also updated. The output of integrator 40 which is the corrected phase angle is fed back to the circuit 12, which then rotates the next received signal.

Thus, in accordance with the above, the aforementioned objects are effectively attained.

Having thus described the invention, what is claimed is:

1. A phase tracking loop for a digital modem of the type wherein the eye pattern constellation output of the modem equalizer is rotated by a phase corrector angle $\phi$ by rotating means, said tracking loop comprising:
    means for multiplying the rotated eye pattern coordinates by a phase reference number to generate a phase error signal;
    a frequency offset integrator which integrates the phase error signal to generate a frequency offset signal,
    a sumer which has an output equal to the sum of the frequency offset signal and the phase error signal; and
    a phase correction integrator which integrates the output of the sumer to generate said phase corrector angle $\phi$.

2. The phase tracking loop of claim 1 wherein the eye pattern diagram is defined by a plurality of complex coordinates and wherein a separate phase reference number corresponds to each coordinate.

3. The phase tracking loop of claim 2 wherein each of said complex coordinate and each of said separate phase reference numbers has a radial component, the coordinates with small radial components being associated with phase reference numbers with larger radial components than the reference numbers associated with coordinates having large radial components.

* * * * *